United States Patent
Ashimine et al.

(10) Patent No.: US 10,332,872 B2
(45) Date of Patent: Jun. 25, 2019

(54) THIN-FILM DEVICE

(71) Applicant: Murata Manufacturing Co., Ltd., Nagaokakyo-shi, Kyoto-fu (JP)

(72) Inventors: Tomoyuki Ashimine, Nagaokakyo (JP); Takashi Komiyama, Nagaokakyo (JP); Toshiyuki Nakaiso, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/674,660

(22) Filed: Aug. 11, 2017

(65) Prior Publication Data

US 2017/0345815 A1 Nov. 30, 2017

Related U.S. Application Data

(63) Continuation of application No. PCT/JP2016/050477, filed on Jan. 8, 2016.

(30) Foreign Application Priority Data

Feb. 12, 2015 (JP) ................................ 2015-024914

(51) Int. Cl.
*H01L 27/02* (2006.01)
*H01L 21/822* (2006.01)
(Continued)

(52) U.S. Cl.
CPC ...... *H01L 27/0288* (2013.01); *H01L 21/3205* (2013.01); *H01L 21/768* (2013.01);
(Continued)

(58) Field of Classification Search
None
See application file for complete search history.

(56) References Cited

U.S. PATENT DOCUMENTS 5,801,065 A * 9/1998 Rizvi .................. H01L 28/20
257/E21.004
6,661,095 B2 12/2003 Ukita
(Continued)

FOREIGN PATENT DOCUMENTS

JP 2003-243522 A 8/2003
JP 2006-332428 A 12/2006
(Continued)

OTHER PUBLICATIONS

International Search Report issued in International Application No. PCT/JP2016/050477, dated Mar. 22, 2016.
(Continued)

*Primary Examiner* — Eduardo A Rodela
*Assistant Examiner* — Nilufa Rahim
(74) *Attorney, Agent, or Firm* — Arent Fox LLP

(57) ABSTRACT

A thin-film device is provided with high reliability that prevents breakage of a thin-film resistance element due to stress caused by expansion of a resin layer. Thin-film resistance elements can be pressed against a substrate with a first constraint thin film that is formed on a resin layer arranged on a resin layer at the opposite side to the substrate so as to overlap with the thin-film resistance elements when seen in the plan view of the device. Therefore, bending stress that is applied to the thin-film resistance elements due to expansion of the resin layers in a high-temperature state can be moderated to thereby prevent breakage of the thin-film resistance elements due to stress caused by the expansion of the resin layers.

20 Claims, 4 Drawing Sheets

(51) Int. Cl.
    H01L 21/3205    (2006.01)
    H01L 23/522     (2006.01)
    H01L 21/768     (2006.01)
    H01L 27/04      (2006.01)
    H01L 49/02      (2006.01)
(52) U.S. Cl.
    CPC .......... H01L 21/822 (2013.01); H01L 23/522 (2013.01); H01L 23/5223 (2013.01); H01L 23/5228 (2013.01); H01L 27/0255 (2013.01); H01L 27/04 (2013.01); H01L 28/20 (2013.01); H01L 28/90 (2013.01)

(56)            References Cited

U.S. PATENT DOCUMENTS

| 8,040,213 | B2 | 10/2011 | Ashikaga |
| 9,047,524 | B2 | 6/2015 | Ikemoto et al. |
| 2003/0157811 | A1 | 8/2003 | Ukita |
| 2008/0206548 | A1* | 8/2008 | Enoki .................... C08G 73/22 428/319.3 |
| 2009/0267727 | A1 | 10/2009 | Ashikaga |
| 2014/0139968 | A1* | 5/2014 | Ikenaga .................... H01G 7/06 361/281 |
| 2014/0225793 | A1 | 8/2014 | Ikemoto et al. |

FOREIGN PATENT DOCUMENTS

| JP | 2009-266964 A | 11/2009 |
| JP | 2009-267248 A | 11/2009 |
| JP | 2010-177506 A | 8/2010 |
| WO | WO 2013/061985 A1 | 5/2013 |
| WO | WO 2013/183472 A1 | 12/2013 |

OTHER PUBLICATIONS

Written Opinion of the International Searching Authority issued in International Application No. PCT/JP2016/050477, dated Mar. 22, 2016.

* cited by examiner

PRIOR ART

THIN-FILM DEVICE

CROSS REFERENCE TO RELATED APPLICATIONS

The present application is a continuation of PCT/JP2016/050477 filed Jan. 8, 2016, which claims priority to Japanese Patent Application No. 2015-024914, filed Feb. 12, 2015, the entire contents of each of which are incorporated herein by reference.

TECHNICAL FIELD

The present disclosure relates to a thin-film device including a thin-film resistance element.

BACKGROUND

Various existing thin-film devices including thin-film resistance elements have been provided, for example, as disclosed in Patent Document 1 (identified below). For example, an existing thin-film device 500 illustrated in FIG. 7 includes an integrated circuit 502 formed on a semiconductor substrate 501, a plurality of electrode pads 503 arranged on the integrated circuit 502, and a resin layer 505 formed on passivation films 504 between the electrode pads 503. The resin layer 505 is made of polyimide resin, epoxy resin, or the like, and through-holes are provided in the resin layer 505 at positions overlapping with the electrode pads 503. Furthermore, rewirings 507 connected to the electrode pads 503 with a barrier metal layer 506 interposed therebetween in the through-holes are formed on the resin layer 505. As further shown, a thin-film resistance element 508 is provided at a position interposed between the rewirings 507 on the resin layer 505.

In the thin-film device 500 illustrated in FIG. 7, the thin-film resistance element 508 includes the barrier metal layer 506 and a seed layer 509 laminated on the barrier metal layer 506. The barrier metal layer 506 can be made from Ti, TiN, Ni, or the like, and is provided in order to improve close contact property between the electrode pads 503 and the rewirings 507. The seed layer 509 functions as an electrode when the rewirings 507 are formed by a plating technique, and is made of Cu, Al, or the like. The film thicknesses of the barrier metal layer 506 and the seed layer 509 are appropriately controlled to adjust a resistance value of the thin-film resistance element 508.

Patent Document 1: Japanese Unexamined Patent Application Publication No. 2009-267248.

When the thin-film device 500 illustrated in FIG. 7 is heated in a heat cycle when being mounted, and so on, on another substrate or the like, bending stress is applied to the thin-film resistance element 508 due to expansion and the like of the resin layer 505. This effect results in a risk of breakage of the thin-film resistance element 508.

SUMMARY

Accordingly, the present disclosure has been made in view of the above-described problem and an object thereof is to provide a technique capable of providing a thin-film device with high reliability, which prevents breakage of a thin-film resistance element due to stress and the like caused by expansion of a resin layer.

In order to achieve the above-described object, a thin-film device is provided that includes a substrate, and a plurality of resin layers laminated at one main surface side of the substrate, wherein the plurality of resin layers include a first resin layer on whose one main surface a thin-film resistance element formed by a thin-film formation process is provided, and a second resin layer which is arranged on the first resin layer at an opposite side to the substrate and on whose one main surface a first constraint thin film formed by a thin-film formation process is provided. Moreover, the thin-film resistance element and the first constraint thin film are arranged to overlap with each other when seen in a plan view of the thin-film device.

In the aspect of the present disclosure, although the first resin layer on which the thin-film resistance element is formed tries to expand to the opposite side to the substrate having a low coefficient of thermal expansion when the thin-film device is heated in a heat cycle when being mounted, and so on, on another substrate or the like, the first constraint thin film is formed on the second resin layer arranged on the first resin layer at the opposite side to the substrate so as to overlap with the thin-film resistance element formed on the first resin layer when seen from the plan view. Accordingly, the thin-film resistance element is made to press against the substrate with the first constraint thin film and bending stress that is applied to the thin-film resistance element due to expansion of the resin layers in a high-temperature state can be moderated to thereby prevent breakage of the thin-film resistance element due to the stress caused by the expansion of the resin layers.

Furthermore, according to an exemplary aspect, a wiring thin-film electrode that is formed by a thin-film formation process and is electrically connected to the thin-film resistance element may be formed on the one main surface of the second resin layer.

With this configuration, the first constraint thin film can be formed by the same thin-film formation process as that for the wiring thin-film electrode using the same material. Therefore, a process for forming the first constraint thin film can be simplified, and the thin-film device with high reliability, which prevents cracks and disconnection of the thin-film resistance element, can be provided using the existing manufacturing process without increasing the manufacturing process.

Furthermore, it is preferable that the first constraint thin film and the wiring thin-film electrode be separately formed.

This configuration can suppress the stress absorbed by the first constraint thin film from being applied to the wiring thin-film electrode.

Furthermore, the first constraint thin film and the wiring thin-film electrode may be integrally formed.

Even with this configuration, the thin-film device can be provided with high reliability that prevents breakage of the thin-film resistance element with the first constraint thin film.

Moreover, it is preferable that the plurality of resin layers further include a third resin layer that is arranged on the first resin layer at the substrate side and on whose one main surface a second constraint thin film formed by a thin-film formation process is provided. Moreover, the thin-film resistance element and the second constraint thin film can be arranged so as to overlap with each other when seen in the plan view.

With this configuration, the thin-film resistance element is interposed between the first constraint thin film on the second resin layer and the second constraint thin film on the third resin layer, such that the bending stress that is applied to the thin-film resistance element due to the expansion of the resin layers in the high-temperature state can be further moderated. As a result, breakage of the thin-film resistance element due to the stress caused by the expansion of the resin layers can be prevented more reliably.

Furthermore, in one exemplary aspect, the thin-film resistance element may contain Si.

According to this configuration, the thin-film device can be provided with high reliability that prevents breakage of the thin-film resistance element that is brittle because it contains Si.

Furthermore, it is preferable that the thin-film device include first to fourth outer electrodes, a variable capacitance-type thin-film capacitor element that is connected between the first and second outer electrodes in series, a first one among the thin-film resistance elements one end of which is connected to the third outer electrode, and a second one among the thin-film resistance elements one end of which is connected to the fourth outer electrode. In this aspect, the other ends of the first and second thin-film resistance elements are respectively connected to both of ends of the thin-film capacitor element such that the thin-film capacitor element is inserted into between the other ends of the first and second thin-film resistance elements.

With this configuration, the thin-film device can be provided that includes the variable capacitance-type thin-film capacitor element using the first and second outer electrodes as input and output terminals. That is to say, the capacitance of the thin-film capacitor element can be controlled by adjusting a voltage between the third and fourth outer electrodes and adjusting, to a desired voltage, a voltage which is applied to both of the ends of the thin-film capacitor element with the first and second thin-film resistance elements interposed therebetween.

Furthermore, the thin-film device may further include an ESD protection element that forms a current path that does not pass through the first and second thin-film resistance elements and the thin-film capacitor element when electro-static discharge of equal to or higher than a predetermined voltage is generated.

With this configuration, when an overvoltage due to the electro-static discharge (ESD) of equal to or higher than the predetermined voltage is generated, the current path which does not pass through the first and second thin-film resistance elements and the thin-film capacitor element is formed by the ESD protection element. Therefore, the first and second thin-film resistance elements and the thin-film capacitor element can be protected from the overvoltage.

According to the present disclosure, a thin-film resistance element can be pressed against a substrate with a first constraint thin film that is formed on a second resin layer arranged on a first resin layer at the opposite side to the substrate so as to overlap with the thin-film resistance element when seen from above. Therefore, bending stress or the like that is applied to the thin-film resistance element due to expansion of resin layers in a high-temperature state can be moderated, thereby preventing breakage of the thin-film resistance element due to the stress and the like caused by the expansion of the resin layers. Accordingly, the thin-film device can be provided with the thin-film resistance element with high reliability.

DETAILED DESCRIPTION

First Embodiment

Figure 1:
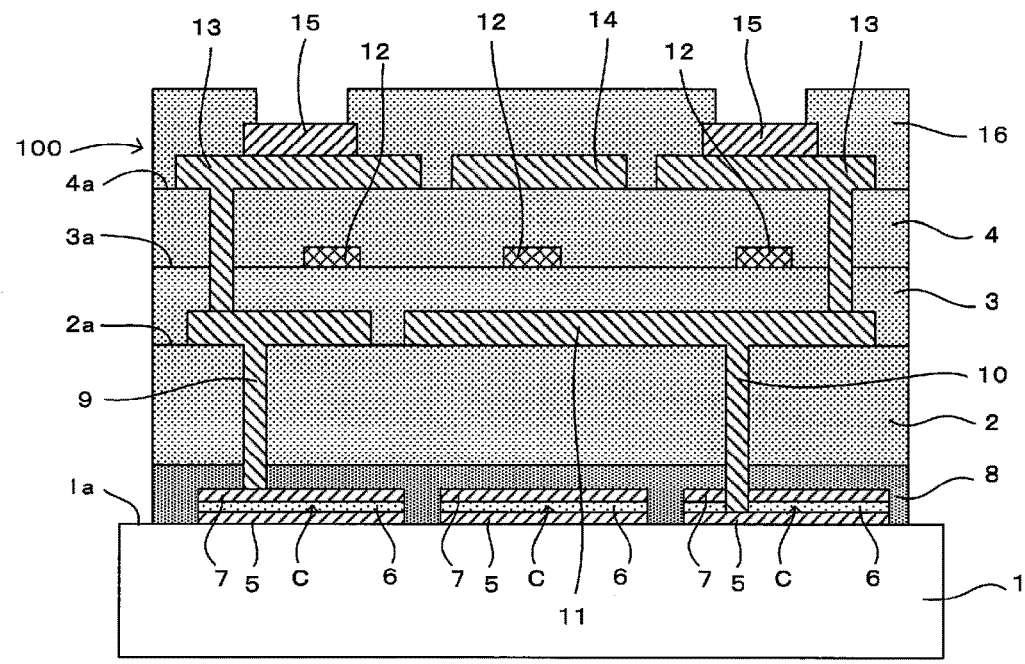
FIG. 1 is a cross-sectional view of a thin-film device according to a first exemplary embodiment.
Figure 2:
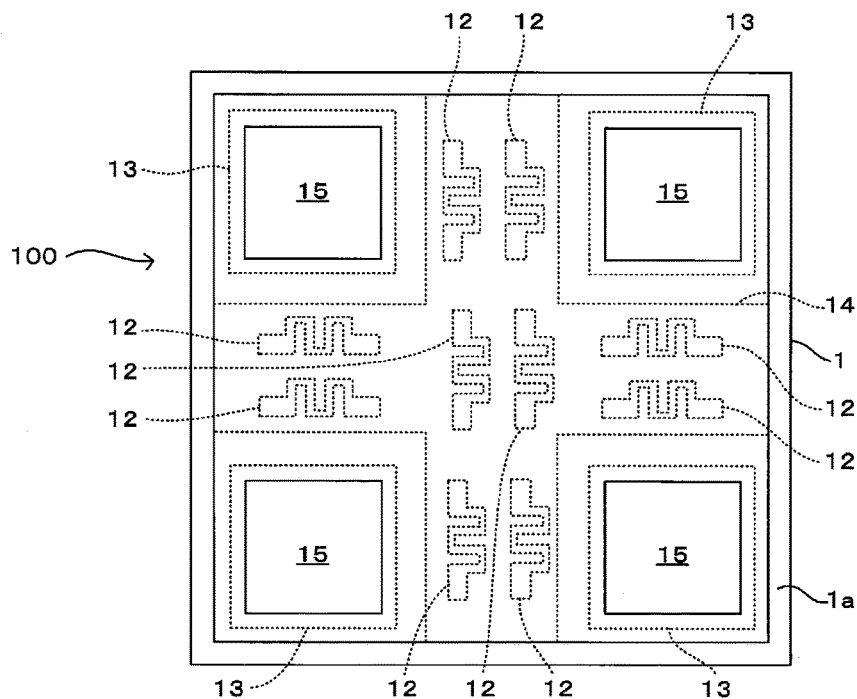
FIG. 2 is a plan view of the thin-film device in FIG. 1.
Figure 4:
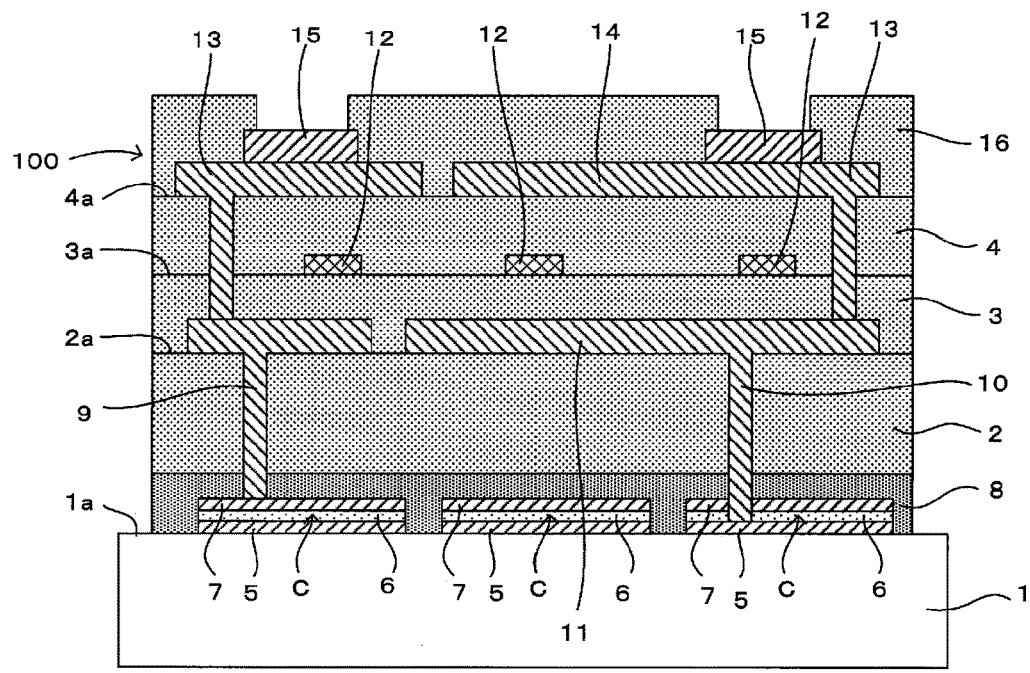
FIG. 4 is a cross-sectional view of a thin-film device according to a second exemplary embodiment.
Figure 5:
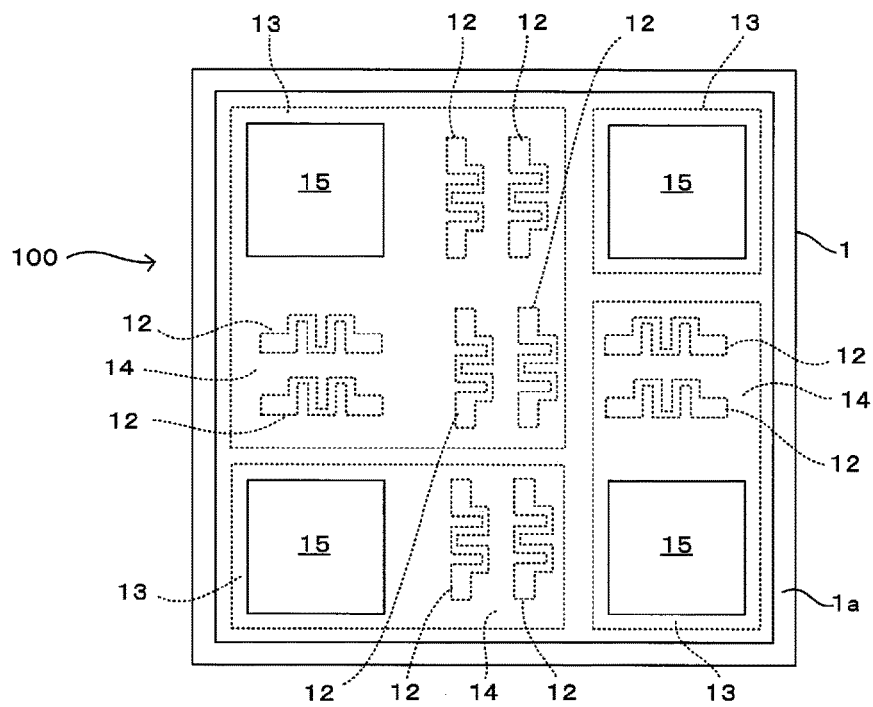
FIG. 5 is a plan view of the thin-film device in FIG. 4.
Figure 6:
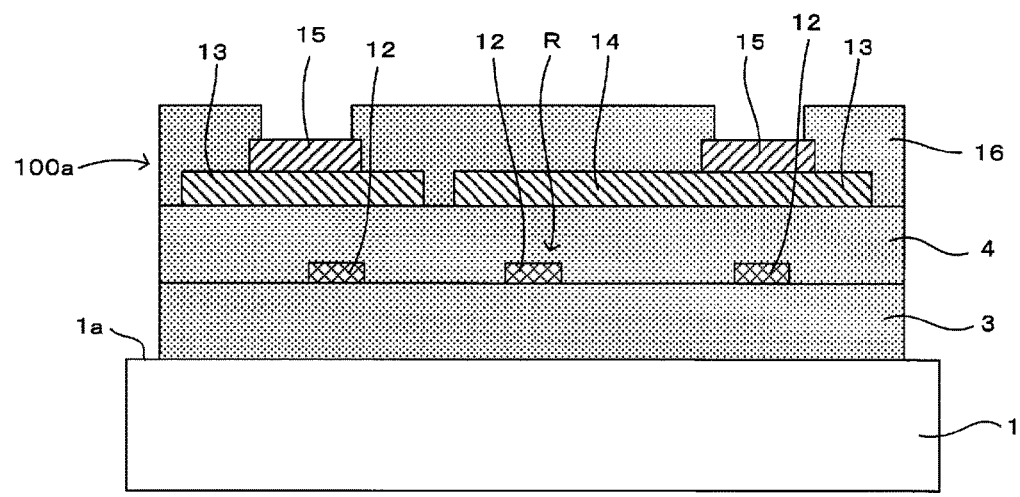
FIG. 6 is a cross-sectional view of a thin-film device according to a third exemplary embodiment.

A first exemplary embodiment will be described with reference to FIG. 1 to FIG. 3. It should be appreciated that FIG. 1 and FIG. 2 illustrate only exemplary configurations according to the present disclosure. FIG. 4 to FIG. 6 to be referred in the description later also illustrate exemplary configurations as in FIG. 1 and FIG. 2, but explanation thereof is omitted in the following description.

(Configuration)

The schematic configuration of an exemplary thin-film device 100 will be described.

The thin-film device 100 includes a substrate 1 such as a glass substrate, a ceramic substrate, a resin substrate, a Si substrate (coefficient of linear expansion of Si: $3.4\times10^{-6}$/K), and a GaAs substrate, a plurality of resin layers 2, 3, and 4 laminated above a main or "primary" surface 1a side of the substrate 1, a plurality of (e.g., ten in the exemplary embodiment) variable capacitance-type thin-film capacitor elements C provided on the one main surface 1a of the substrate 1, a plurality of (e.g., seven in the exemplary embodiment) first thin-film resistance elements R1 (i.e., a "thin-film resistance element" according to the exemplary embodiment), a plurality of (e.g., six in the exemplary embodiment) second thin-film resistance elements R2 (i.e., the "thin-film resistance element" according to the exemplary embodiment), and a plurality of (e.g., two in the exemplary embodiment) ESD protection elements D1 and D2.

Preferably, the thin-film capacitor elements C are formed by capacitor electrode layers 5 formed with Pt thin films in predetermined regions on the one main surface 1a of the substrate 1, (Ba,Sr)TiO$_3$ (hereinafter, referred to as "BST") dielectric layers 6, and capacitor electrode layers 7 formed with Pt thin films on the BST dielectric layers 6.

As shown, the thin-film capacitor elements C are covered by a protection layer 8 formed with a SiO$_2$ moisture-resistant protection film, and the resin layer 2 is laminated on the protection layer 8. On one main surface 2a of the resin layer 2, a Cu/Ti extended electrode 9 connected to the capacitor electrode layer 7 at the upper side in the thin-film capacitor element C with a through-hole formed in the protection layer 8 and the resin layer 2 interposed therebetween, a Cu/Ti extended electrode 10 connected to the capacitor electrode layer 5 at the lower side in the thin-film capacitor element C, and a second constraint thin film 11 are formed.

Preferably, the second constraint thin film 11 is formed at the same time as the extended electrodes 9 and 10 using the same material by the same thin-film formation process. Furthermore, the resin layer 3 is laminated on the resin layer 2 while covering the extended electrodes 9 and 10 and the second constraint thin film 11. Although the second constraint thin film 11 and the extended electrode 10 are integrally formed in the embodiment, it should be appreciated that the second constraint thin film 11 and the extended electrode 10 may be separately formed or the second constraint thin film 11 may be formed integrally with another extended electrode formed on the one main surface 2a of the resin layer 2.

According to the exemplary aspect, the thin-film resistance elements R1 and R2 are respectively formed by resistance thin films 12 containing Ni, Cr, and Si as main components, which are formed, by a thin-film formation process, in predetermined regions on one main surface 3a of the resin layer 3, with the coefficient of linear expansion of the resin layer 3 being $54.0 \times 10^{-6}$/K). In the exemplary embodiment, all of the thin-film resistance elements R1 and R2 are formed on the resin layer 3. Alternatively, the respective thin-film resistance elements R1 and R2 may be arranged on different resin layers in a disperse manner.

The respective thin-film resistance elements R1 and R2 (resistance thin films 12) are covered by the resin layer 4 laminated on the one main surface 3a of the resin layer 3. On one main surface 4a of the resin layer 4, with the coefficient of linear expansion of the resin layer 4 being $54.0 \times 10^{-6}$/K, Cu/Ti extended electrodes 13 (i.e., a "wiring thin-film electrode" according to the exemplary embodiment), with the coefficient of linear expansion of Cu being $16.5 \times 10^{-6}$/K and the coefficient of linear expansion of Ti being $8.6 \times 10^{-6}$/K, that are electrically connected to the extended electrodes 9 and 10 and the thin-film resistance elements R1 and R2 with through-holes formed in the resin layers 3 and 4 interposed therebetween, and a first constraint thin film 14 is formed. Preferably, the first constraint thin film 14 is formed at the same time as the extended electrodes 13 using the same material by the same thin-film formation process. The first constraint thin film 14 and the extended electrode 13 are separately formed.

As illustrated in FIG. 1 and FIG. 2, the first constraint thin film 14 on the resin layer 4 arranged on the resin layer 3 at the opposite side to the substrate 1 and the thin-film resistance elements R1 and R2 (i.e., the resistance thin films 12) are arranged so as to overlap with each other when seen in the plan view of the device (i.e., in a direction from the top to the bottom of the thin film device, that is, in the vertical direction of FIG. 1, for example). Moreover, the second constraint thin film 11 on the resin layer 2 arranged on the resin layer 3 at the substrate 1 side and the thin-film resistance elements R1 and R2 (i.e., resistance thin films 12) are also arranged so as to overlap with each other when seen in the plane view of the device. Although the first and second constraint thin films 14 and 11 are formed so as to overlap with all of the resistance thin films 12 when seen in the plan view of the device, it si noted that each of the first and second constraint thin films 14 and 11 may be formed while being separated into a plurality of pieces so as to individually overlap with each of the resistance thin films 12 when seen in the plan view or overlap with each group formed by the plurality of resistance thin films 12 when seen in the plan view of the device.

Moreover, a plurality of Au/Ni outer electrodes 15 are formed on the extended electrodes 13 and a protection layer 16 made of resin is laminated on the one main surface 4a of the resin layer 4 so as to cover the extended electrodes 13, the first constraint thin film 14, and end edge portions of the respective outer electrodes 15.

Figure 3:
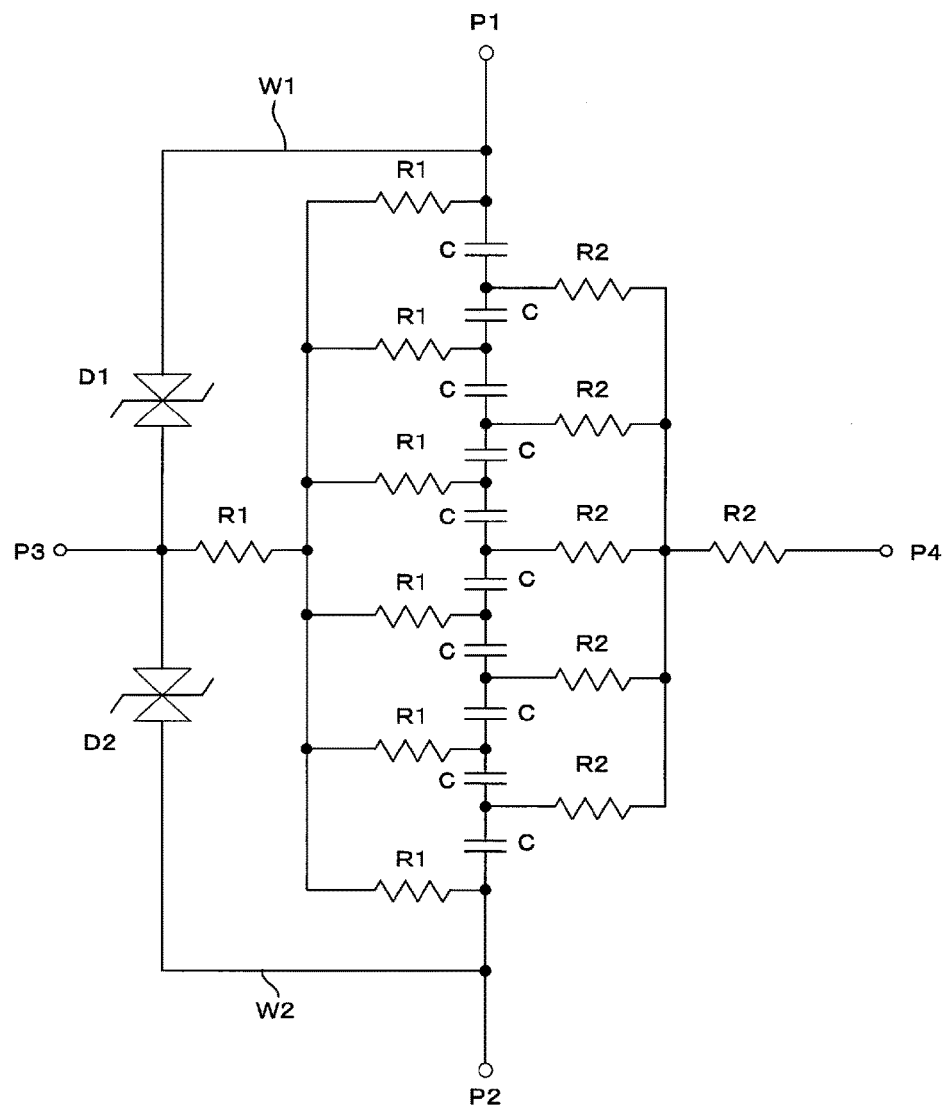
FIG. 3 is a view illustrating an electric circuit included in the thin-film device in FIG. 1.

As illustrated in FIG. 3, each of the ESD protection elements D1 and D2 is formed by a bi-directional zener diode. A method for forming the bi-directional zener diode is not particularly limited. Although not illustrated in the drawing, for example, each of the ESD protection elements D1 and D2 can be formed by pn junction of a first conductive semiconductor thin film of any one of a p type and an n type and a second conductive semiconductor thin film of the other one of the p type and the n type, or can be formed by film formation of a semiconductor film with n-type a-Si on the substrate 1 that is doped with B, being formed into the p type, and is made of Si.

As illustrated in FIG. 3, the thin-film device 100 configured as described above includes first to fourth outer electrodes P1 to P4 that are respectively formed by the outer electrodes 15 and the ten thin-film capacitor elements C are connected in series between the first and second outer electrodes P1 and P2. One end of the respective first thin-film resistance elements R1 and one end of the respective second thin-film resistance elements R2 are connected to both of the ends of the respective thin-film capacitor elements C such that any one of the plurality of thin-film capacitor elements C is inserted into between one end of any of the plurality of first thin-film resistance elements R1 the other end of which is connected to the third outer electrode P3 and one end of any of the second thin-film resistance elements R2 the other end of which is connected to the fourth outer electrode P4.

Furthermore, the ESD protection element D1 is connected in series between the first and third outer electrodes P1 and P3 and the ESD protection element D2 is connected in series between the second and third outer electrodes P2 and P3 such that current paths W1 and W2, which do not pass through the first and second thin-film resistance elements R1 and R2 and the thin-film capacitor elements C, are formed when electro-static discharge (ESD) of equal to or higher than a predetermined voltage is generated.

Accordingly, when an overvoltage due to the electrostatic discharge of equal to or higher than the predetermined voltage is generated, the current paths W1 and W2 which do not pass through the first and second thin-film resistance elements R1 and R2 and the thin-film capacitor elements C are formed by the ESD protection elements D1 and D2. Therefore, the first and second thin-film resistance elements R1 and R2 and the thin-film capacitor elements C can be protected from the overvoltage.

(Manufacturing Method)

An example of a method for manufacturing the thin-film device 100 will be described. In the embodiment, the substrate 1 having a large area is used and an assembly of the plurality of thin-film devices 100 is formed, and then, divided into pieces. With this, the plurality of thin-film devices 100 are simultaneously formed. In the following description, explanation of the method for forming the ESD protection elements D1 and D2 is omitted.

First, the capacitor electrode layers 5 and the dielectric layers 6 at the lower side and the capacitor electrode layers 7 at the upper side are formed in the predetermined regions on the substrate 1 made of, for example, Si to form the plurality of thin-film capacitor elements C, and the protection layer 8 covering the respective thin-film capacitor elements C is formed. Then, the resin layer 2 formed with a polybenzoxazole-based photosensitive resin insulating film, for example, in which the through-holes are formed by photolithography is formed and is subject to heat processing for solidifying the resin layer.

Subsequently, an $SiO_2$ moisture-resistant protection film in the through-holes in the resin layer 2 is removed by dry etching and a Ti film forming the extended electrodes 9 and 10 and the second constraint thin film 11 is formed and a Cu film is formed thereon using a sputtering method. Then, the extended electrodes 9 and 10 and the second constraint thin film 11 are formed by pattern formation by etching by photolithography. After that, the resin layer 3 formed with a phenol-based photosensitive resin insulating film, for example, in which the through-holes are formed by photolithography is formed and is subject to heat processing for solidifying the resin layer.

Subsequently, a lift-off resist is formed and the resistance thin films 12 are formed by vapor deposition by a lift-off method using a vapor deposition material made of a mixture containing Ni, Cr, and Si as the main components. In this case, the respective resistance thin films 12 are arranged so as to overlap with the second constraint thin film 11 when seen from above. It should be noted that arrangement with which a part or all of the plurality of resistance thin films 12 overlap with the extended electrodes 9 and 10 instead of the second constraint thin film 11 when seen from above may be employed.

Subsequently, the resin layer 4 formed with a phenol-based photosensitive resin insulating film in which the through-holes are formed by photolithography is formed and is subject to heat processing for solidifying the resin layer. Then, a Ti film forming the extended electrodes 13 and the first constraint thin film 14 is formed and a Cu film is formed thereon using a sputtering method.

After that, a resist in which openings are provided at predetermined positions is pattern-formed on the formed Cu/Ti film, and the outer electrodes 15 forming the first to fourth outer electrodes P1 to P4 are formed at predetermined positions on the Cu/Ti film by a plating technique. Thereafter the resist is removed, the Cu/Ti film is pattern-formed by etching by photolithography to form the extended electrodes 13 and the first constraint thin film 14. In this case, the first constraint thin film 14 is arranged so as to overlap with the respective resistance thin films 12 when seen from above. It is noted that arrangement with which a part of the plurality of resistance thin films 12 overlaps with the extended electrodes 13 instead of the first constraint thin film 14 when seen in the plan view may be employed.

Thereafter, the protection layer 16 formed with a phenol-based photosensitive resin insulating film in which outer electrode exposing portions are formed by photolithography is formed and is subject to heat processing for solidifying the resin layer. Then, the provided assembly is cut into the respective thin-film devices 100 with a dicing machine, thereby completing the thin-film devices 100.

According to the exemplary embodiment, the thin-film device 100 described above is mounted on another wiring substrate or the like using soldering, wire bonding, or the like to be used as a variable capacitance-type element using the first and second outer electrodes P1 and P2 as input and output terminals. That is to say, the capacitances of the respective thin-film capacitor elements C can be controlled by adjusting a voltage between the third and fourth outer electrodes P3 and P4 and adjusting, to a desired voltage, a voltage which is applied to both of the ends of the respective thin-film capacitor elements C with the first and second thin-film resistance elements R1 and R2 interposed therebetween. An electric circuit illustrated in FIG. 3 is an example. It should be appreciated that the number of variable capacitor elements C, the number of first and second thin-film resistance elements R1 and R2, and the number of ESD protection elements D1 and D2 are not limited to those illustrated in FIG. 3.

As described above, in the exemplary embodiment, although the first resin layer 3 on which the thin-film resistance elements are formed will expand to the opposite side to the substrate 1 having a low coefficient of thermal expansion when the thin-film device 100 is heated in a heat cycle when being mounted, and so on, on another substrate or the like, the first constraint thin film 14 is formed on the resin layer 4 arranged at the upper layer side relative to the resin layer 3 so as to overlap with the thin-film resistance elements formed on the resin layer 3 when seen in the plan view of the device. Accordingly, the thin-film resistance elements R1 and R2 are pressed against the substrate 1 with the first constraint thin film 14 and bending stress that is applied to the respective thin-film resistance elements R1 and R2 (i.e., resistance thin films 12) due to expansion of the resin layer 3 in a high-temperature state can be moderated. As a result, breakage of the respective thin-film resistance elements R1 and R2 due to stress caused by expansion of the respective resin layers 2 to 4 can be prevented.

Furthermore, the respective thin-film resistance elements R1 and R2 are arranged between the substrate 1 and the first constraint thin film 14. Therefore, stress which is generated by impact when the thin-film device 100 is mounted on another substrate or the like can be prevented from being directly applied to the respective thin-film resistance elements R1 and R2.

In the exemplary embodiment, as illustrated in FIG. 2, the first constraint thin film 14 is formed to extend to the end edge portions of the resin layer 3 so as to be exposed to the side surfaces of the thin-film device 100. Accordingly, stress absorbed by the first constraint thin film 14 can be effectively released to the side surfaces of the thin-film device 100.

Furthermore, the first constraint thin film 14 can be formed on the one main surface 3a of the resin layer 3 by the same thin-film formation process as that for the extended electrodes 13 using the same material. Therefore, a process for forming the first constraint thin film 14 can be simplified. Accordingly, the thin-film device 100 can be provided with high reliability that prevents cracks and disconnection of the respective thin-film resistance elements R1 and R2 (i.e., resistance thin films 12) using the existing manufacturing process without the manufacturing process being complex.

According to an exemplary aspect, the first constraint thin film 14 and the extended electrodes 13 are separately formed. Therefore, the stress absorbed by the first constraint thin film 14 can be suppressed from being applied to the extended electrodes 13.

The second constraint thin film 11 is arranged on the one main surface 2a of the resin layer 2 arranged at the substrate 1 side relative to the resin layer 3 so as to overlap with the respective thin-film resistance elements R1 and R2 when seen from above. Therefore, the respective thin-film resistance elements R1 and R2 are made into states of being interposed between the first constraint thin film 14 on the resin layer 4 and the second constraint thin film 11 on the resin layer 2. Therefore, the bending stress that is applied to the respective thin-film resistance elements R1 and R2 due to the expansion of the resin layers 2 to 4 in the high-temperature state can be further moderated, thereby further preventing breakage of the respective thin-film resistance elements R1 and R2 (i.e., resistance thin films 12) due to the stress caused by the expansion of the resin layers 2 to 4 more reliably.

With the above-described configuration, the thin-film device 100 can be provided with high reliability that prevents breakage of the respective thin-film resistance elements R1 and R2 that are brittle because they contain Si.

Second Embodiment

A second exemplary embodiment will be described with reference to FIG. 4 and FIG. 5.

The second exemplary embodiment is different from the above-described first embodiment in a point that the first constraint thin films 14 and the extended electrodes 13 are integrally formed as illustrated in FIG. 4 and FIG. 5. Other configurations thereof are the same as those of the above-described first exemplary embodiment and explanation of the configurations thereof is omitted by applying the same reference numerals.

Even when the first constraint thin films 14 and the extended electrodes 13 are integrally formed as described above, the thin-film device 100 can be provided with high reliability that prevents breakage of the respective thin-film resistance elements R1 and R2 with the first constraint thin films 14.

Third Embodiment

A third exemplary embodiment will be described with reference to FIG. 6.

The third exemplary embodiment is different from the above-described first embodiment in a point that no second constraint thin film 11 is provided as illustrated in FIG. 6. In the following description, the point which is different from the above-described first embodiment is mainly explained. Other configurations thereof are the same as those of the above-described first exemplary embodiment and explanation of the configurations thereof is omitted by applying the same reference numerals.

(Configuration)

The schematic configuration of a thin-film device 100a is described.

The thin-film device 100a includes the substrate 1, the plurality of resin layers 3 and 4 laminated at the one main surface 1a side of the substrate 1, and thin-film resistance elements R.

Preferably, the thin-film resistance elements R are formed by the resistance thin films 12 containing Ni, Cr, and Si as main components, which are formed, by a thin-film formation process, in predetermined regions on the one main surface 3a of the resin layer 3 laminated on the one main surface 1a of the substrate 1. The thin-film resistance elements R (i.e., resistance thin films 12) are covered by the resin layer 4 laminated on the one main surface 3a of the resin layer 3. The Cu/Ti extended electrodes 13 that are electrically connected to the thin-film resistance elements R via through-holes (not illustrated) formed in the resin layer 4 and the first constraint thin film 14 are formed on the one main surface 4a of the resin layer 4. In the same manner as the above-described first embodiment, the first constraint thin film 14 and the thin-film resistance elements R (i.e., resistance thin films 12) are arranged so as to overlap with each other when seen in the plan view of the device. Although the first constraint thin film 14 and the extended electrodes 13 are integrally formed in the embodiment, it is noted that the first constraint thin film 14 and the extended electrodes 13 may be separately formed.

As shown, the plurality of Au/Ni outer electrodes 15 are formed on the extended electrodes 13, and the protection layer 16 made of resin is laminated on the one main surface 4a of the resin layer 4 so as to cover the extended electrodes 13, the first constraint thin film 14, and the end edge portions of the respective outer electrodes 15.

(Manufacturing Method)

An example of a method for manufacturing the thin-film device 100a will be described. In the same manner as the above-described first embodiment, the substrate 1 having a large area is used and an assembly of the plurality of thin-film devices 100a is formed, and then, divided into pieces. With this, the plurality of thin-film devices 100 are simultaneously formed.

First, the resin layer 3 formed with a polybenzoxazole-based photosensitive resin insulating film, for example, is formed on the substrate 1 made of, for example, Si and is subject to heat processing for solidifying the resin layer. Subsequently, a lift-off resist is formed and the resistance thin films 12 are formed by vapor deposition by a lift-off method using a vapor deposition material made of a mixture containing Ni, Cr, and Si as main components. Then, the resin layer 4 formed with a phenol-based photosensitive resin insulating film in which the through-holes (not illustrated) are formed by photolithography is formed and is subject to heat processing for solidifying the resin layer. Thereafter, a Ti film forming the extended electrodes 13 and the first constraint thin film 14 is formed and a Cu film is formed thereon using a sputtering method.

After that, a resist in which openings are provided at predetermined positions is pattern-formed on the formed Cu/Ti film, and the outer electrodes 15 are formed at predetermined positions on the Cu/Ti film by a plating technique. Thereafter, the resist is removed, and then, the Cu/Ti film is pattern-formed by etching by photolithography to form the extended electrodes 13 and the first constraint thin film 14. In this case, as in the above-described first embodiment, the first constraint thin film 14 is arranged so as to overlap with the respective resistance thin films 12 when seen from above. It is noted that arrangement with which a part of the plurality of resistance thin films 12 overlap with the extended electrodes 13 instead of the first constraint thin film 14 when seen from above may be employed.

Thereafter, the protection layer 16 formed with a phenol-based photosensitive resin insulating film in which outer electrode exposing portions are formed by photolithography is formed and is subject to heat processing for solidifying the resin layer. Then, the provided assembly is cut into the respective thin-film devices 100a with a dicing machine, thereby completing the thin-film devices 100a.

As described above, in the exemplary embodiment, in the same manner as the above-described first embodiment, the thin-film resistance elements R are pressed against the substrate 1 with the first constraint thin film 14. Therefore, bending stress that is applied to the thin-film resistance elements R (i.e., resistance thin films 12) can be moderated even when the resin layer 3 expands in a high-temperature state, for example, thereby preventing breakage of the thin-film resistance elements R due to stress caused by expansion of the respective resin layers 3 and 4.

Figure 7:
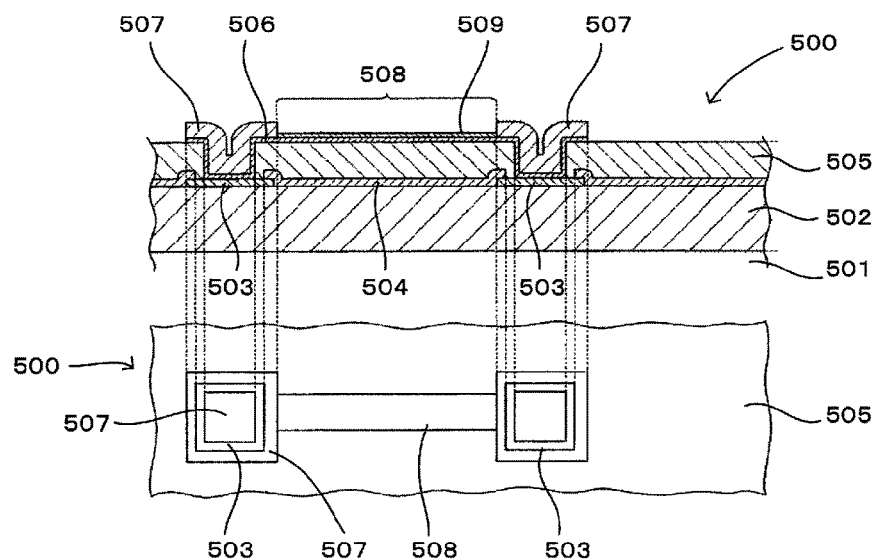
FIG. 7 is an enlarged view illustrating a main part of an existing thin-film device, an upper side view is a schematic cross-sectional view of the main part, and a lower side view is a schematic top see-through view of the main part.

It should be appreciated that the present disclosure is not limited to the above-described embodiments. In addition to the above-described exemplary embodiments, various changes can be made without departing from the gist thereof and the above-described embodiments may be combined in any manner. For example, the material of the thin-film resistance elements R or R1 and R2 (i.e., resistance thin films 12) is not limited to the above-described example. The thin-film resistance elements R or R1 and R2 may be made of, for example, a CrSi alloy. Alternatively, the thin-film resistance elements R or R1 and R2 may be made of a conductive material such as Pt as in the existing thin-film device 500 illustrated in FIG. 7, for example.

Furthermore, it is preferable that the first constraint thin film 14 and/or the second constraint thin film 11 be arranged so as to cover (overlap with) the overall thin-film resistance elements R or R1 and R2 (i.e., resistance thin films 12) when seen from above. With this configuration, stress can be uniformly applied to the overall resistance thin films 12 for the thin-film resistance elements R or R1 and R2 when the resin layers 2 to 4 expand. Therefore, bending stress can be prevented from being applied to the resistance thin films 12 (thin-film resistance elements R or R1 and R2) more reliably, thereby preventing breakage of the respective thin-film resistance elements R or R1 and R2 more reliably.

A thin-film device in which various circuits including the thin-film resistance elements are configured can be provided by appropriately combining thin-film circuit elements such as a thin-film capacitor element, a thin-film inductor element, and a thin-film thermistor element in addition to the thin-film resistance elements. In this case, it is sufficient that the configurations of the thin-film capacitor element, the thin-film inductor element, and the thin-film thermistor element have the common configuration of the thin-film circuit element. To be specific, for example, a device for adjusting antenna sensitivity in a short-distance communication device or a photodiode noise filter device can be configured by the thin-film device according to the present disclosure.

Moreover, a dielectric element material forming the dielectric layers is not limited to the above-described example. For example, the dielectric layers may be made of a dielectric material such as $BaTiO_3$, $SrTiO_3$, $PbTiO_3$, and so on.

It is noted that the exemplary embodiments can be widely applied to a thin-film device including a thin-film resistance element.

REFERENCE SIGNS LIST

1 SUBSTRATE
2, 3, 4 RESIN LAYER
1a, 2a, 3a, 4a ONE MAIN SURFACE
11 SECOND CONSTRAINT THIN FILM
13 EXTENDED ELECTRODE (WIRING THIN-FILM ELECTRODE)
14 FIRST CONSTRAINT THIN FILM
100, 100a THIN-FILM DEVICE
C THIN-FILM CAPACITOR ELEMENT
D1, D2 ESD PROTECTION ELEMENT
P1 FIRST OUTER ELECTRODE
P2 SECOND OUTER ELECTRODE
P3 THIRD OUTER ELECTRODE
P4 FOURTH OUTER ELECTRODE
R THIN-FILM RESISTANCE ELEMENT
R1 FIRST THIN-FILM RESISTANCE ELEMENT (THIN-FILM RESISTANCE ELEMENT)
R2 SECOND THIN-FILM RESISTANCE ELEMENT (THIN-FILM RESISTANCE ELEMENT)
W1, W2 CURRENT PATH

The invention claimed is:

1. A thin-film device comprising:
a substrate;
a first resin layer disposed above a principal surface of the substrate;
at least one thin-film resistance element disposed above a surface of the first resin layer opposite the substrate;
a second resin layer disposed above the surface of the first resin layer and the at least one thin-film resistance element; and
a first constraint thin film disposed above the second resin layer opposite the first resin layer,
wherein the first constraint thin film is conductive and completely covers the at least one thin-film resistance element in a plan view of the thin-film device, and
wherein the second resin layer is disposed directly between at least a portion of the at least one thin-film resistance element and the first constraint film.

2. The thin-film device according to claim 1, further comprising a wiring thin-film electrode electrically connected to the at least one thin-film resistance element is disposed above the second resin layer opposite the first resin layer.

3. The thin-film device according to claim 2, wherein the first constraint thin film and the wiring thin-film electrode are formed as separate components.

4. The thin-film device according to claim 2, wherein the first constraint thin film and the wiring thin-film electrode are integrally formed.

5. The thin-film device according to claim 2, further comprising first, second, third and fourth outer electrodes disposed above the wiring thin-film electrode.

6. The thin-film device according to claim 5, further comprising at least one thin-film capacitor element electrically connected in series between the first and second outer electrodes.

7. The thin-film device according to claim 6,
wherein the at least one thin-film resistance element comprises a plurality of thin-film resistance elements,
wherein a first end of a first of the plurality of thin-film resistance elements is connected to the third outer electrode, and
wherein a first end of a second of the plurality of thin-film resistance elements is connected to the fourth outer electrode.

8. The thin-film device according to claim 7, wherein respective second ends of the first and second thin-film resistance elements are connected to respective ends of the at least one thin-film capacitor element such that the at least one thin-film capacitor element is disposed between the respective second ends of the first and second thin-film resistance elements.

9. The thin-film device according to claim 8, further comprising an ESD protection element that provides a current path that does not pass through the first and second thin-film resistance elements and the thin-film capacitor element when electro-static discharge is generated in the thin-film device that is equal to or higher than a predetermined voltage.

10. The thin-film device according to claim 9, wherein the ESD protection element is electrically connected between either the first and third outer electrodes or the second and fourth outer electrodes.

11. The thin-film device according to claim 5, further comprising a protection layer disposed on at least a portion of each of the second resin layer, the wiring thin-film electrode, and edge portions of each of the first, second, third and fourth outer electrodes.

12. The thin-film device according to claim 11, further comprising a third resin layer disposed between the principal surface of the substrate and the first resin layer.

13. The thin-film device according to claim 12, further comprising a second constraint thin film disposed above the third resin layer with at least a portion of the second constraint thin film overlapping the at least one thin-film resistance element in the plan view of the thin-film device.

14. The thin-film device according to claim 13, wherein the first resin layer is directly disposed on the second constraint thin film and a portion of the third resin layer.

15. The thin-film device according to claim 11, wherein the thin-film resistance element comprises silicon (Si).

16. The thin-film device according to claim 11, wherein the first constraint thin film is structurally configured to press the at least one thin-film resistance element towards the substrate to protect the at least one thin-film resistance element from expansion of the first resin layer.

17. A thin-film device comprising:
- a substrate;
- at least one thin-film capacitor element disposed above a principal surface of the substrate;
- a first resin layer disposed above the at least one thin-film capacitor element;
- a first constraint thin film disposed above a surface of the first resin layer opposite the substrate and electrically connected to the at least one thin-film capacitor element;
- a second resin layer disposed above the first constraint thin film;
- at least one thin-film resistance element disposed above a surface of the second resin layer and opposite to the first resin layer;
- a third resin layer disposed on the second resin layer and opposite to the first resin layer, such that the third resin layer covers the at least one thin-film resistance element; and
- a second constraint thin film that is conductive and is disposed above the third resin layer and opposite to the at least one thin-film resistance element, such that the second constraint thin film and the at least one thin-film resistance element overlap each other with the second constraint thin film completely covering the at least one thin-film resistance element in a plan view of the thin-film device.

18. The thin-film device according to claim 17, wherein at least a portion of the first constraint thin film overlaps the at least one thin-film resistance element in the plan view of the thin-film device.

19. The thin-film device according to claim 17, further comprising:
- at least one wiring thin-film electrode electrically connected to the at least one thin-film resistance element and disposed above the third resin layer opposite the second resin layer; and
- first, second, third and fourth outer electrodes disposed above the wiring thin-film electrode,
- wherein the at least one thin-film capacitor element is electrically connected in series between the first and second outer electrodes,
- wherein the at least one thin-film resistance element comprises a plurality of thin-film resistance elements,
- wherein a first end of a first of the plurality of thin-film resistance elements is connected to the third outer electrode,
- wherein a first end of a second of the plurality of thin-film resistance elements is connected to the fourth outer electrode, and
- wherein respective second ends of the first and second thin-film resistance elements are connected to respective ends of the at least one thin-film capacitor element.

20. The thin-film device according to claim 17, wherein the second constraint thin film is structurally configured to press the at least one thin-film resistance element towards the substrate to protect the at least one thin-film resistance element from expansion of the second resin layer.

* * * * *